(12) United States Patent
Shin et al.

(10) Patent No.: US 9,513,346 B2
(45) Date of Patent: Dec. 6, 2016

(54) MAGNETIC SENSORS WITH PERMANENT MAGNETS MAGNETIZED IN DIFFERENT DIRECTIONS

(71) Applicant: INVENSENSE, INC., San Jose, CA (US)

(72) Inventors: Jong Il Shin, San Jose, CA (US); Jongwoo Shin, Pleasanton, CA (US)

(73) Assignee: INVENSENSE, INC., San Jose, CA (US)

( * ) Notice: Subject to any disclaimer, the term of this patent is extended or adjusted under 35 U.S.C. 154(b) by 101 days.

(21) Appl. No.: 14/149,779

(22) Filed: Jan. 7, 2014

(65) Prior Publication Data

US 2015/0192646 A1 Jul. 9, 2015

(51) Int. Cl.
*G01R 33/02* (2006.01)
*G01R 33/038* (2006.01)
*G01C 17/04* (2006.01)

(52) U.S. Cl.
CPC ............ *G01R 33/038* (2013.01); *G01C 17/04* (2013.01)

(58) Field of Classification Search
CPC ......... G11C 11/00; G11C 11/15; G01C 17/04; G01C 17/02; G01R 33/038; G01R 33/18; G01R 33/0052; G01R 33/02; G01R 3/0385; G01R 3/093; H01L 27/222; H01L 43/12; G11B 5/39; G11B 5/33; G11B 5/127; G11B 5/3909; G11B 5/3903; G11B 5/3932; G01V 3/00; G01V 3/08; G01V 3/40
USPC .............. 324/249, 252, 259, 207.11, 207.13, 244,324/260, 262; 257/427; 360/324.1–324.12; 438/3; 365/158, 185
See application file for complete search history.

(56) References Cited

U.S. PATENT DOCUMENTS

| 7,969,637 | B1* | 6/2011 | Fu | G02B 26/0841 359/224.1 |
|---|---|---|---|---|
| 2005/0054120 | A1* | 3/2005 | Wakui et al. | 438/3 |
| 2005/0207073 | A1* | 9/2005 | Carey et al. | 360/324.12 |
| 2009/0059444 | A1* | 3/2009 | Mather et al. | 360/324.11 |
| 2009/0139330 | A1* | 6/2009 | Pavelescu | G01D 21/02 73/514.32 |
| 2010/0242603 | A1* | 9/2010 | Miller | B81B 7/02 73/514.32 |
| 2011/0165365 | A1* | 7/2011 | Brault et al. | 428/68 |
| 2012/0049843 | A1* | 3/2012 | Sun et al. | 324/249 |
| 2012/0176128 | A1* | 7/2012 | Seeger | G01R 33/038 324/244 |
| 2012/0206134 | A1* | 8/2012 | Fischer | G01R 33/091 324/244 |
| 2014/0026658 | A1* | 1/2014 | Zhang | B81B 5/00 73/504.12 |

(Continued)

*Primary Examiner* — Arleen M Vazquez
*Assistant Examiner* — Steven Yeninas
(74) *Attorney, Agent, or Firm* — Minisandram Law Firm; Raghunath S. Minisandram

(57) ABSTRACT

A method and system for a device with a magnetic sensor includes a first permanent magnet and a second permanent magnet. The first permanent magnet and the second permanent magnet of the magnetic sensor have at least one alternating ferromagnetic (FM) layer and antiferromagnetic (AFM) layer. The first permanent magnet is magnetized in a first direction and the second permanent magnet is magnetized in a second direction which is substantially orthogonal to the first direction. The blocking temperature of the AFM layer of the first permanent magnet is higher than the blocking temperature of the AFM layer of the second permanent magnet.

40 Claims, 8 Drawing Sheets

(56) References Cited

U.S. PATENT DOCUMENTS

| | | | |
|---|---|---|---|
| 2014/0264657 A1* | 9/2014 | Gogoi | 257/416 |
| 2014/0266170 A1* | 9/2014 | Seeger | G01P 15/08 324/227 |
| 2014/0308757 A1* | 10/2014 | Ju | B81B 3/0032 438/3 |

* cited by examiner

FIG. 2A
FIG. 2B
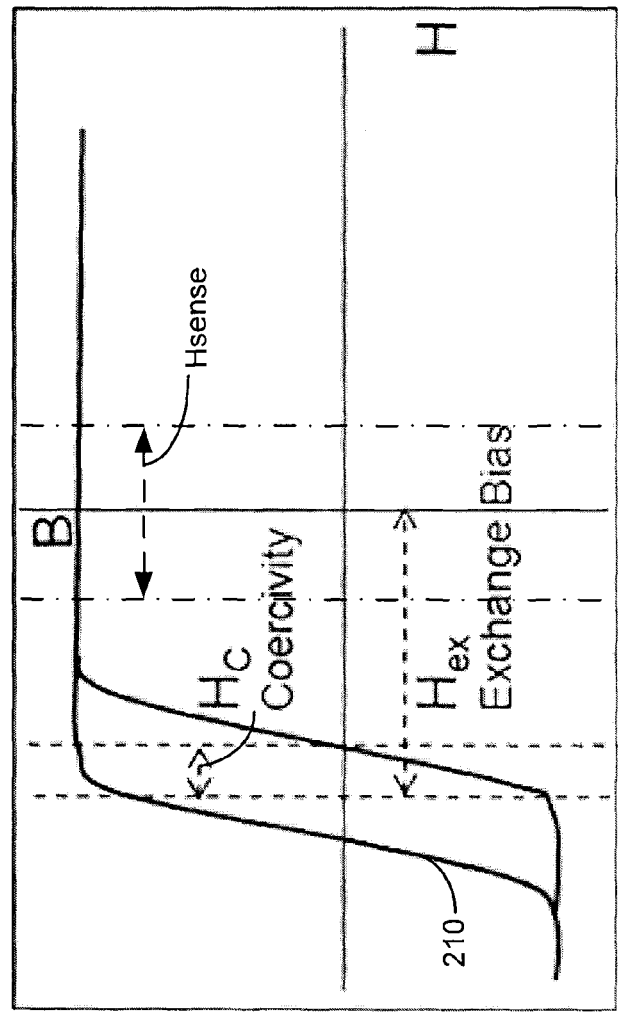
FIG. 2C

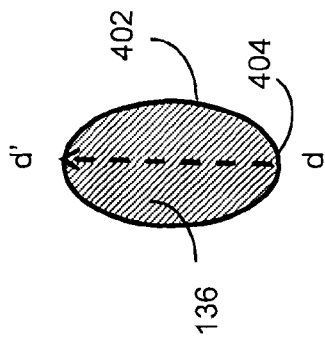
FIG. 4D
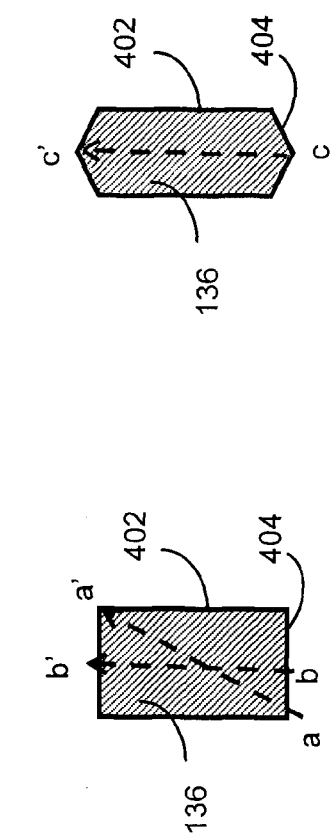
FIG. 4C
FIG. 4A
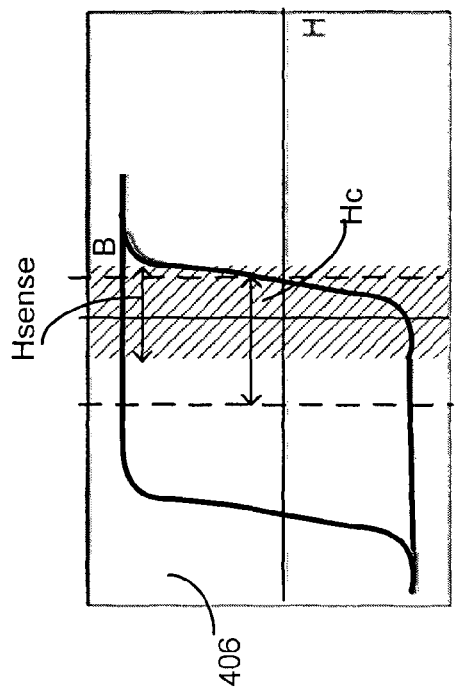
FIG. 4B

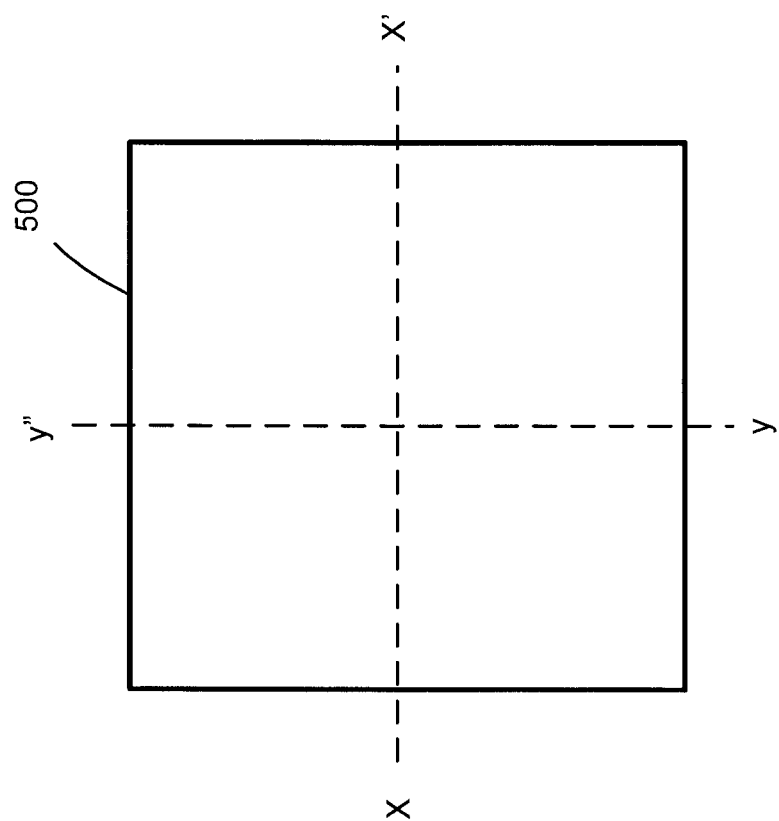

MAGNETIC SENSORS WITH PERMANENT MAGNETS MAGNETIZED IN DIFFERENT DIRECTIONS

TECHNICAL FIELD

The present invention relates generally to magnetic sensors with permanent magnets and more particularly, to permanent magnets that are magnetized in different directions.

DESCRIPTION OF RELATED ART

Magnetic sensors may be formed in semiconductor devices. Magnetic sensors may include one or more permanent magnets. Permanent magnets magnetized in a specific direction if permitted to move, tend to align with earth's magnetic poles, namely earth's magnetic north and magnetic south poles. Magnetic sensors with movable permanent magnets embedded in a device may be configured to measure change in the orientation of the device, based on the change in the position of the movable permanent magnet with reference to the earth's magnetic field.

For example, to measure change with reference to a given X axis, the permanent magnet is preferably magnetized along the Y axis. If on the other hand, to measure change with reference to a given Y axis, for example, in a direction orthogonal to X axis, the permanent magnet is preferably magnetized along the X axis.

Generally, permanent magnets are magnetized and oriented in a given direction by applying a magnetic field in the desired direction. Magnetic sensors built with permanent magnets to measure changes in more than one direction require permanent magnets to be magnetized in different directions.

With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a device with a magnetic sensor is disclosed. The magnetic sensor includes a first permanent magnet and a second permanent magnet. The first permanent magnet and the second permanent magnet have at least one alternating ferromagnetic (FM) layer and antiferromagnetic (AFM) layer. The first permanent magnet is magnetized in a first direction and the second permanent magnet is magnetized in a second direction that is substantially orthogonal to the first direction. The blocking temperature of the AFM layer of the first permanent magnet is higher than the blocking temperature of the AFM layer of the second permanent magnet.

In yet another embodiment, a method for providing a device is disclosed. The device includes a magnetic sensor with a first permanent magnet and a second permanent magnet. The first permanent magnet and the second permanent magnet have at least one alternating ferromagnetic (FM) layer and antiferromagnetic (AFM) layer. The first permanent magnet is magnetized in a first direction and the second permanent magnet is magnetized in a second direction that is substantially orthogonal to the first direction. The blocking temperature of the AFM layer of the first permanent magnet is higher than the blocking temperature of the AFM layer of the second permanent magnet.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following Figures:

FIG. 2A shows a first permanent magnet of the magnetic sensor, according to one aspect of the present disclosure;

FIG. 2B shows a second permanent magnet of the magnetic sensor, according to one aspect of the present disclosure;

FIG. 2C shows an example B-H curve for a ferromagnetic layer coupled to an antiferromagnetic layer, according to one aspect of the present disclosure;

FIGS. 4A, 4C and 4D shows alternate shapes of the permanent magnet, according to one aspect of the present disclosure;

FIG. 4B shows an example B-H curve for a magnetic film with high aspect ratio, according to one aspect of the present disclosure;

FIG. 5 shows a plan view of a substrate, according to one aspect of the present disclosure;

DETAILED DESCRIPTION

To facilitate an understanding of the adaptive aspects of the present disclosure, an exemplary magnetic sensor with permanent magnets magnetized in two different directions is described. The specific construction and operation of the adaptive aspects of the permanent magnets of the present disclosure are described with reference to the exemplary magnetic sensor.

Figure 1:
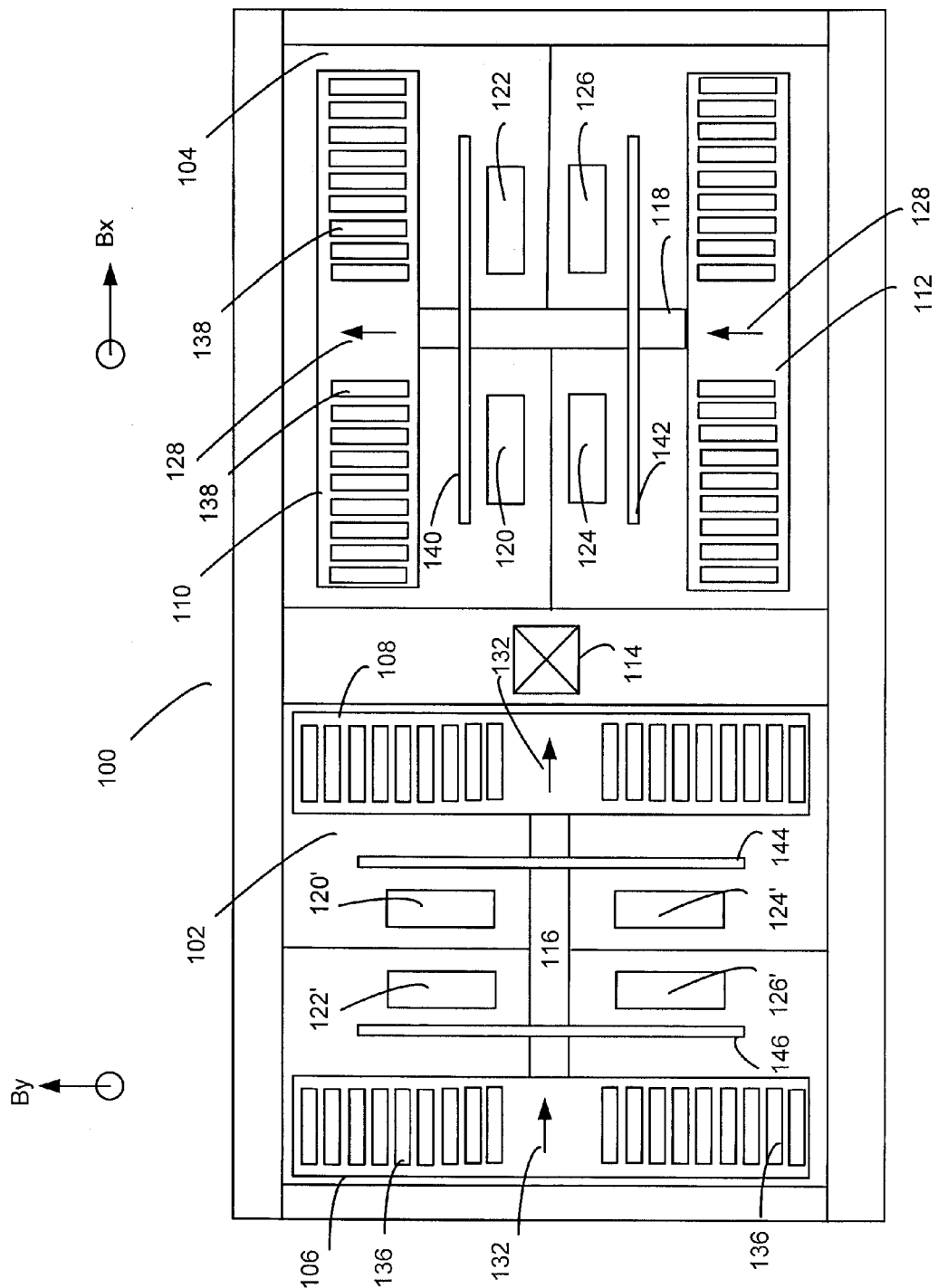
FIG. 1 shows a magnetic sensor with permanent magnets magnetized in two different directions, according to one aspect of the present disclosure.

FIG. 1 shows a MEMS device 100, in accordance with an embodiment of this disclosure. The MEMS device 100 is an exemplary two-axis-magnetometer. The MEMS device 100 is shown to include proof masses 102, and 104, a first magnet bank 106, a second magnet bank 108, a third magnet bank 110 and a fourth magnet bank 112. The MEMS device 100 further includes an anchor 114, springs 116 and 118, and sensing elements 120, 122, 124, 126, 120', 122', 124' and 126'.

The first magnet bank 106 and the second magnet bank 108 are disposed on a surface of an end of the proof mass 102. The third magnet bank 110 and fourth magnet bank 112 are disposed on a surface of an end of the proof mass 104. First magnet bank 106 and second magnet bank 108 each have a plurality of first permanent magnets 136. Third magnet bank 110 and fourth magnet bank 112 each have a plurality of second permanent magnets 138. Plurality of first permanent magnets 136 are magnetized in a first direction and the plurality of second permanent magnets 138 are magnetized in a second direction. Construction and features of first permanent magnets 136 and second permanent magnets 138 will be later described in detail.

Four sensing elements 120, 122, 124 and 126 are positioned substantially in the middle of the proof mass 104. The sensing elements 120-126 are disposed along the x-axis. The proof mass 102 is substantially 90 degrees rotated relative to the proof mass 104. The sensing elements 120'-126' are positioned in the middle of the proof mass 102 and are substantially along the y-axis. The sensing elements 120 and 122 are disposed on the same side of the proof mass 104 where the third magnet bank 110 is located and positioned along the x-axis. The sensing elements 124 and 126 are disposed on the same side of the proof mass 104 where the fourth magnet bank 112 is located and positioned along the x-axis. The plurality of second permanent magnets 138 are magnetized along the y-axis, as shown by arrow 128. The sensing elements 120' and 122' are disposed on the same side of the proof mass 102 where the first magnet bank 106 is located and positioned along the y-axis. The sensing elements 124' and 126' are disposed on the same side of the proof mass 102 where the second magnet bank 108 is located and positioned along the y-axis. The plurality of first permanent magnets 136 are magnetized along the x-axis, as shown by arrow 130. Proof mass 102 is suspended from spring 116. Proof mass 104 is suspended from spring 118.

In some examples, the sensing elements may be configured as capacitors, with a pair of electrodes and a dielectric in between the pair of electrodes. As one skilled in the art appreciates, air may form a dielectric. When the gap between the pair of electrodes in a capacitor increases, the capacitance value decreases and when the gap between the pair of electrodes decreases, the capacitance value increases. The detection of two inputs that corresponds to change in magnetic field in x-axis (for example, based on an external magnetic field Bx) and a change in magnetic field in y-axis (for example, based on an external magnetic field By) is done by placing one increasing and one decreasing capacitance in each arm of a bridge.

For example, a first electrode 140 may form one of the electrodes of sensing elements 120 and 122. A second electrode 142 may form one of the electrodes of sensing elements 124 and 126. When an external magnetic field Bx is applied (in positive x direction), the third magnet bank 110 and the forth magnet bank 112 rotate in a clockwise direction. This moves the first electrode 140 and second electrode 142, resulting in a change in the gap between the pair of electrodes that form each of the sensing elements 120, 122, 124 and 126. Change in the gap between the pair of electrodes results in a change in the capacitance value of corresponding sensing elements 120, 122, 124 and 126.

Similarly, a third electrode 144 may form one of the electrodes of sensing elements 120' and 122'. A fourth electrode 146 may form one of the electrodes of sensing elements 124' and 126'. When an external magnetic field By is applied (in positive y direction), the first magnet bank 106 and the second magnet bank 108 rotate in a counter-clockwise direction. This moves the third electrode 144 and fourth electrode 146, resulting in a change in the gap between the pair of electrodes that form each of the sensing elements 120', 122', 124' and 126'. Change in the gap between the pair of electrodes results in a change in the capacitance value of corresponding sensing elements 120', 122', 124' and 126'.

Exemplary capacitance change is as follows for the two types of inputs:

For an external magnetic field applied in the positive x direction, capacitances of the sensing elements 122 and 124 increase, while capacitances of the sensing elements 120 and 126 decrease. For an external magnetic field applied in the negative x direction, capacitances of sensing elements 120 and 126 increase, while capacitances of the sensing elements 122 and 124 decrease.

For an external magnetic field applied in the positive y direction, capacitances of the sensing elements 120' and 126' increase, while capacitances of the sensing elements 122' and 124' decreases. For an external magnetic field applied in the negative x direction, capacitances of sensing elements 122' and 124' increase, while capacitances of sensing elements 120' and 126' decrease.

Having described an exemplary MEMS device 100 with first permanent magnet 136 and second permanent magnet 138, construction and features of first permanent magnet 136 and second permanent magnet 138 will now be described with reference to FIGS. 2A-2D, 3A-3B and 4A-4D.

FIG. 2A shows first permanent magnet 136. First permanent magnet 136 has at least one ferromagnetic layer FM1 202 and one antiferromagnetic layer AFM1 204. Ferromagnetic layer may be sometimes referred to as FM layer. Antiferromagnetic layer may be sometimes referred to as AFM layer.

FIG. 2B shows second permanent magnet 138. Second permanent magnet 138 has at least one ferromagnetic layer FM2 206 and antiferromagnetic layer AFM2 208.

Now, referring to FIG. 2C, an exemplary B-H curve for a FM layer coupled to an AFM layer is shown. Interfacial coupling between AFM layer and FM layer is the source of exchange bias in an AFM/FM film stack. Exchange bias (Hex) causes shifting or biasing of magnetic hysteresis loop 210 to the one side of H-axis and makes it possible to maintain desired magnetic property within full sensing magnetic field range (Hsense) even after an exposure to a strong external magnetic field in the opposite direction. Coercivity (Hc) or coercive field is a measure of a ferromagnetic material representing how large of an external magnetic field it can withstand before changing the direction of magnetization.

A temperature at or above which an antiferromagnetic layer loses its ability to pin the magnetization direction of an adjacent ferromagnetic layer is called blocking temperature (Tblock) of that AFM layer. Magnetization direction of AFM/FM magnet is not changed when an external field is first applied and then removed at a temperature lower than the blocking temperature. In one example, the blocking temperature of the AFM1 204 layer of first permanent magnet 136 is different than the blocking temperature of the AFM2 208 layer of second permanent magnet 138. In one example, the blocking temperature Ta of the AFM1 204 layer is higher than the blocking temperature Tb of the AFM2 208 layer.

Figures 3A, 3B:
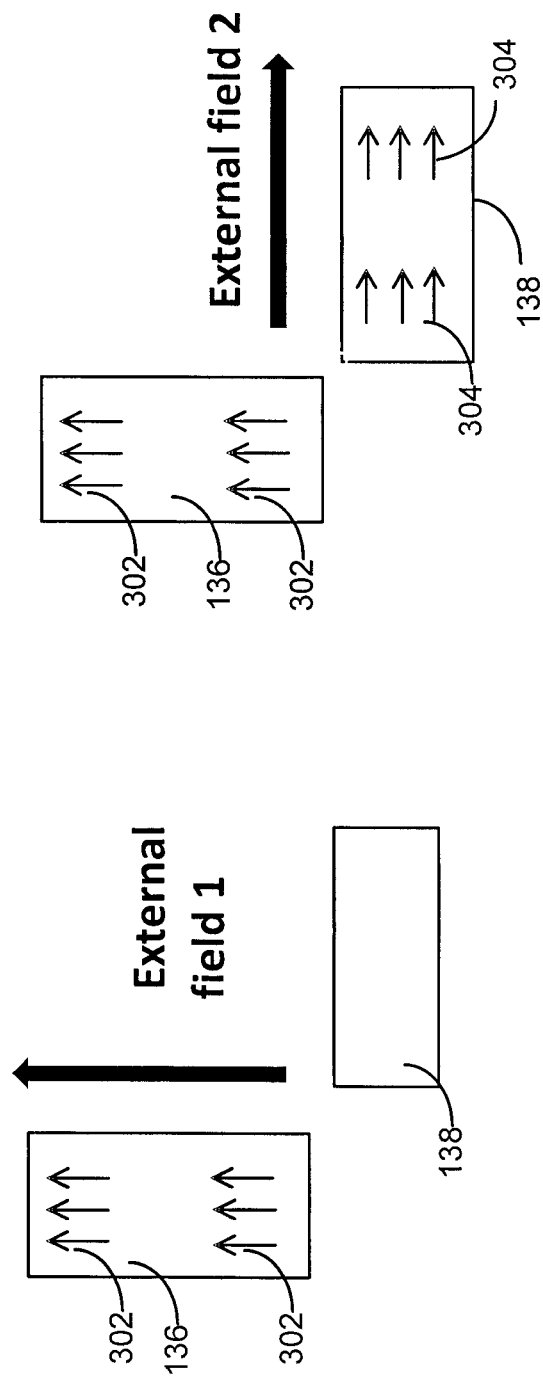
FIG. 3A shows magnetic orientation of first permanent magnet after application of magnetic field in a first direction, according to one aspect of the present disclosure.
FIG. 3B shows magnetic orientation of the first permanent magnet and the second permanent magnet, after application of a magnetic field in the second direction, according to one aspect of the present disclosure.

Referring now to FIG. 3A, first permanent magnet 136 with arrows 302 showing the magnetic orientation in a first direction is shown. As an example, alternating layers of FM1 and AFM1 films are deposited to form the first permanent magnet 136. The blocking temperature of the AFM1 layer is Ta. A first external magnetic field (External field 1) is applied in the desired direction of orientation for the first magnet, after raising the temperature of the films above the blocking temperature Ta for the AFM layer. After application of the first external magnetic field, the temperature is lowered below the blocking temperature Ta. Now, the first permanent magnet 136 is magnetized in a first direction that corresponds to the direction of the applied magnetic field.

Referring now to FIG. 3B, first permanent magnet 136 with arrows 302 showing the magnetic orientation in a first direction is shown. Additionally, second permanent magnet 138 with arrows 304 showing the magnetic orientation in a second direction is shown. As an example, alternating layers of FM2 and AFM2 films are deposited to form the second permanent magnet 128. The blocking temperature of the AFM layer of second permanent magnet is Tb, which is less than the blocking temperature Ta of AFM layer of first permanent magnet 136.

A second external magnetic field (External field 2) is applied in the desired direction of orientation for the second magnet, after raising the temperature of the films above the blocking temperature Tb for the AFM2 layer of second permanent magnet 138, but below the blocking temperature Ta for the AFM1 layer of the first permanent magnet 136. After application of the second external magnetic field, the temperature is lowered below the blocking temperature Tb. Now, the second permanent magnet 138 is magnetized in a second direction that corresponds to the direction of the applied magnetic field. As one skilled in the art appreciates, as the blocking temperature Ta of the AFM1 layer of first permanent magnet 136 is higher than the blocking temperature Tb of the AFM2 layer of second permanent magnet 138, the magnetic orientation of the first permanent magnet 136 remains in the first direction, even though the first permanent magnet 136 may be exposed to the applied second magnetic field in the second direction.

An example AFM1 204 layer material for the first permanent magnet 136 may be nickel manganese (NiMn) based alloy, which has a blocking temperature Tblock of about 350 degree centigrade. An example AFM2 208 layer material for the second permanent magnet 138 may be ferromanganese (FeMn) based alloy, which has a blocking temperature Tblock of about 170 degree centigrade. As an example, first permanent magnet 136 with NiMn AFM1 layer may be magnetized in a first direction, by raising the temperature of the FM1/AFM1 layer higher than 350 degree centigrade and applying the magnetic field in the first direction. Second permanent magnet 138 with FeMn AFM2 layer may be magnetized in a second direction, by raising the temperature of the FM2/AFM2 layer higher than blocking temperature Tb, but lower than blocking temperature Ta and applying the magnetic field in the second direction. For example, by raising the temperature of the magnetic film stack to about 250 degree centigrade.

In one example, a plurality of alternating layers of FM and AFM layers may be formed. For example, each AFM and FM layer thickness may be in the range of 10 Angstroms to 1000 Angstroms. In some examples, the total thickness of the alternating AFM and FM layer may be in the range of about 0.1 micrometer to about 1.5 micrometers.

Now referring to FIG. 4A, an exemplary first permanent magnet 136 deposited in a stripe shape is shown. For example, the first permanent magnet 136 has a long side 402 and a short side 404. Aspect ratio Ar of the film is defined by the length of the long side 402 as compared to the width of the short side 404. For example, an aspect ratio Ar of 1:1 indicates a square form, where the length of the long side 402 is same as the width of the short side 404. Similarly, an aspect ratio Ar of 1:10 indicates a narrow rectangle form, where the length of the long side 402 is ten times longer than the width of the short side 404.

When a magnetic field is applied in the first direction, magnetzation preferably occurs along an axis that corresponds to an elongated portion the deposited film. This phenomenon is known as shape anisotropy. For example, for the long stripe form shown, magnetization may occur along an axis a-a', which is the longest possible distance, in the long stripe form. However, preferred magnetization direction for the long stripe form is along an axis b-b'. As one skilled in the art appreciates, the preferred axis b-b' runs substantially parallel to the long side of the stripe form.

One way to achieve magnetization in a direction substantially parallel to the long side of the stripe form is to have a high aspect ratio for the deposited film, for example, an aspect ratio Ar in the range of 10:1 or higher. However, when a high aspect ratio stripe pattern is used, for example, aspect ratio of about 10:1 or higher, the coercivity Hc of the magnetic film increases.

For example, referring to FIG. 4B, an exemplary B-H curve 406 for a magnetic film with high aspect ratio Ar is shown. The B-H curve 406 shown in FIG. 4B is similar to the the B-H curve 210 shown in FIG. 2C, except that the coercivity (Hc) of the magnetic film in this example is significantly higher than the coercivity (Hc) for the magnetic film shown in FIG. 2C. High aspect ratio Ar of the film in this example causes an increase in coercivity. With increase in coercivity, we can no longer maintain desired magnetic field within full sensing magnetic field range (Hsense), as the hysteresis loop for the magnetic film overlaps with the full magnetic field range.

In some embodiments, it may be preferable to have a magnetic strip that forms the first permanent magnet 136 and second permanent magnet 138 with a long side and a short side with a shaped short side. The short side may be shaped such that the longest distance along the long side is substantially along the center of the magnetic stripe form. Example magnetic stripe form with such a construction is shown in FIG. 4C and FIG. 4D.

Referring to FIG. 4C, a permanent magnet, for example, first permanent magnet 136 has a long side 402. The short side 404 has a shape of an isosceles triangle. The longest distance along the long side is substantially along the center of the magnetic stripe form, for example, along the axis c-c', passing through the vertex of the isosceles triangle. As previously discussed, when a magnetic field is applied to the first permanent magnet 136 in a direction substantially along the axis c-c', the magnetic orientation of the first permanent magnet will be substantially along the axis c-c'.

Now, referring to FIG. 4D, a permanent magnet, for example, first permanent magnet 136 has a long side 402 and a short side 404. In this example, the short side 404 has a shape of a symmetric convex parabola. The longest distance along the long side is substantially along the center of the magnetic stripe form, for example, along the axis d-d'. As previously discussed, when a magnetic field is applied to the first permanent magnet 136 in a direction substantially along the axis d-d', the magnetic orientation of the first permanent magnet 136 will be substantially along the axis d-d'.

As one skilled in the art appreciates, using shape anisotropy, any possible misalignment or offset in the magnetization direction may be minimized, when the first permanent magnet and second permanent magnet are formed. Further, using an alternating layer of FM/AFM layers, for example, as described with reference to FIGS. 2A and 2B permits use of magnetic strip pattern with smaller aspect ratio Ar, for example, aspect ratio Ar in the range of about 1:1 to about 1:5.

Figure 5A:
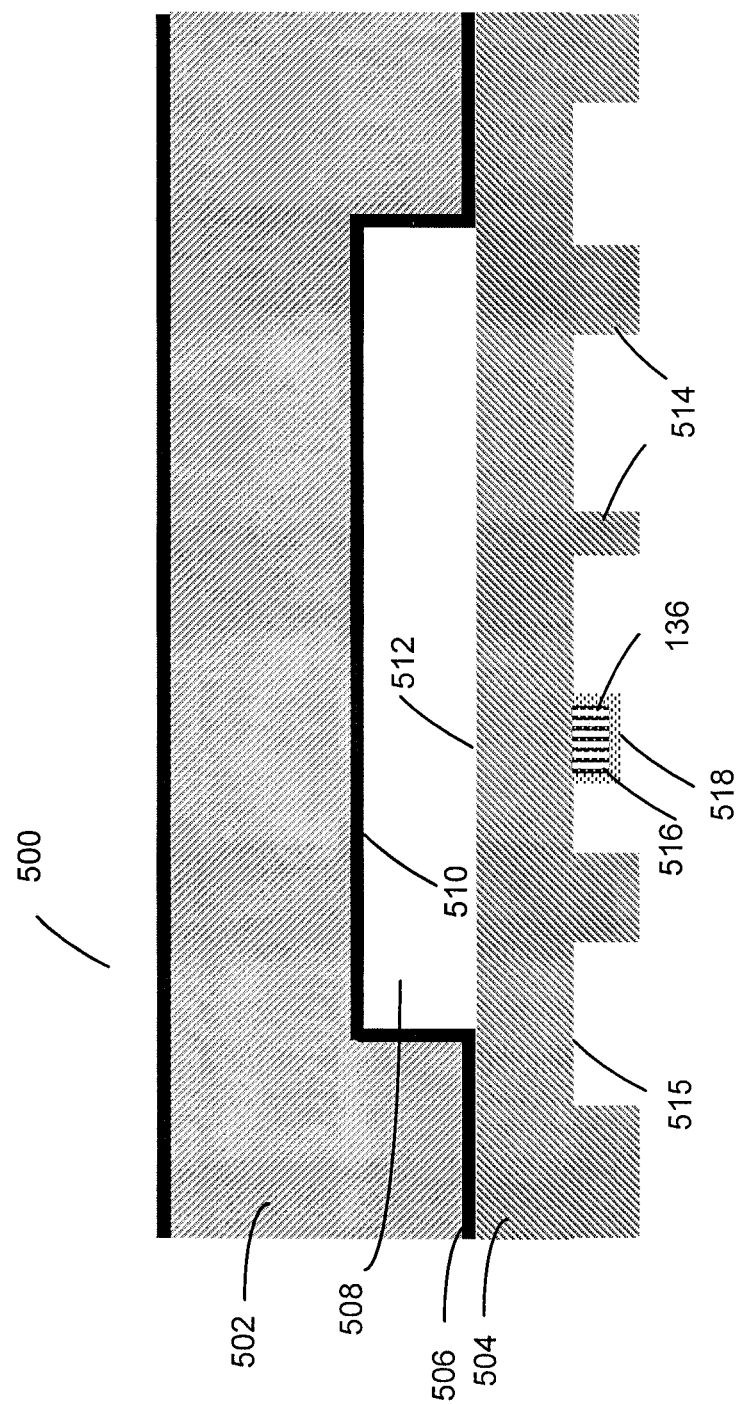
FIG. 5A shows a cross-section of the substrate of FIG. 5, along a first axis, with the first permanent magnet, according to one aspect of the present disclosure.
Figure 5B:
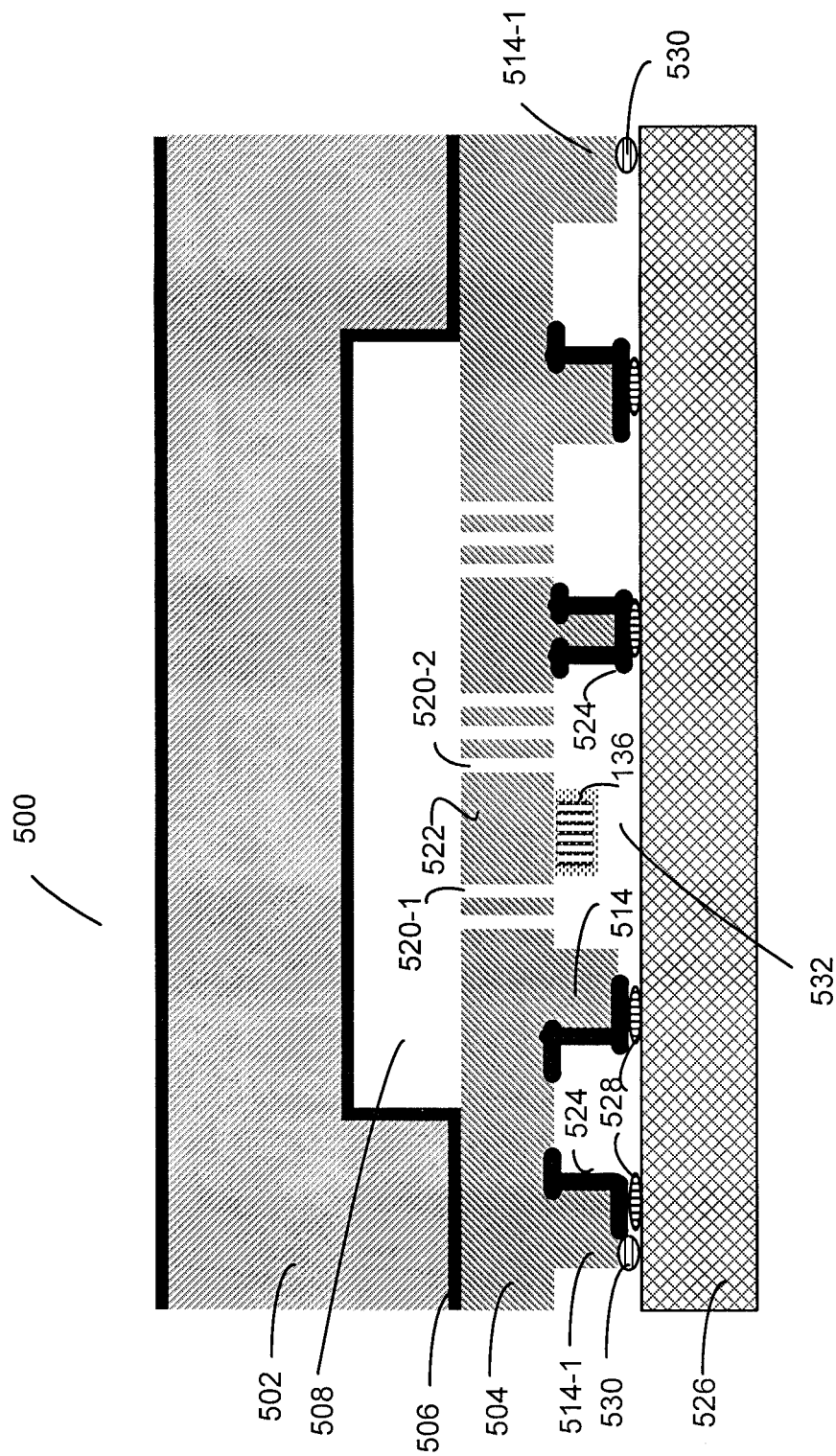
FIG. 5B shows a cross-section of the substrate of FIG. 5A, with trenches and electrical pads, according to one aspect of the present disclosure.
Figure 5C:
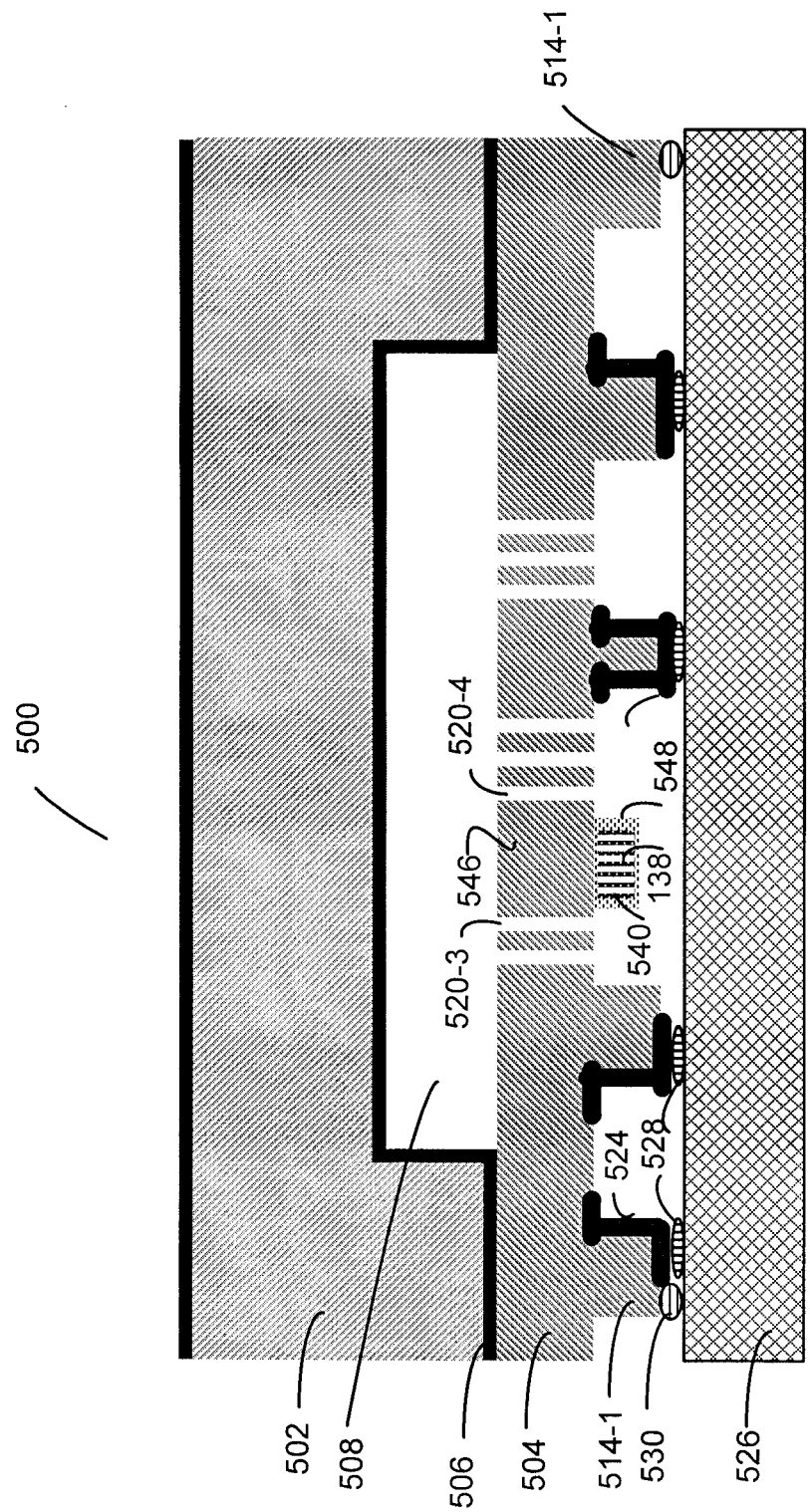
FIG. 5C shows a cross-section of the substrate of FIG. 5, along a second axis, with the second permanent magnet, according to one aspect of the present disclosure.

Now, referring to FIGS. 5, 5A, 5B and 5C, an exemplary substrate with the first permanent magnet and second permanent magnet is described. FIG. 5 shows a device with substrate 500. FIGS. 5A and 5B show a cross-section of the substrate 500 shown in FIG. 5, along an axis x-x', with the first permanent magnet, according to one aspect of the present disclosure. FIG. 5C shows a cross-section of the substrate 500 shown in FIG. 5, along an axis y-y', with the second permanent magnet, according to one aspect of the present disclosure. In one example, the axis x-x' is orthogonal to the axis y-y'.

Substrate 500 includes a handle layer 502 and a device layer 504. In one example, the device layer 504 may be correspond to the proof mass 102 and 104 described with reference to MEMS device 100 of FIG. 1. In one example, a single device layer 504 may correspond to both proof mass 102 and 104.

A fusion bond layer 506 bonds the handle layer 502 to device layer 504, to form an upper cavity 508, defined by the lower side 510 of the handle layer 502 and upper side 512 of the device layer 504.

Now referring to device layer 504, a plurality of standoff 514 structures are formed on the device layer 504, for example, by deep reactive ion etching (DRIE) process. Functions and features of standoff 514 will be further described with reference to FIG. 5B. Now, alternating layers of FM/AFM layers are deposited and patterned on the lower side 515 of the device layer 504, to form a first magnetic strip 516. FM layers and AFM layers may be FM1 layer and AFM1 layer, as described with reference to FIG. 2A. Patterns of the deposited first magnetic strip 516 may be as described with reference to FIG. 4C and FIG. 4D. Note than when an external magnetic field in a first direction is applied to the first magnetic strip 516, at a temperature above the blocking temperature of the AFM1 material, the plurality of first magnetic strip 516 will be oriented in the first direction, to form first permanent magnet 136, as described with reference to FIG. 2A. The process of applying a temperature above the blocking temperature and applying a magnetic field may sometimes be referred to as magnetic annealing process.

In some embodiments, a protective layer 518 is deposited over the first permanent magnet 136, to prevent oxidization of the first permanent magnet 510. For example, protective layer 518 may be an oxide layer deposited using a low temperature plasma-enhanced chemical vapor deposition (PECVD) process. Protective layer 518 is preferably deposited immediately after forming the first magnetic strip 516 and prior to magnetic annealing process in order to minimize potential oxidization of first magnetic strip 516, for example, due to exposure to ambient environment.

Now, referring to FIG. 5B, substrate 500 will be further described. FIG. 5B shows trench patterns 520-1 and 520-2, an actuator 522, device pads 524, integrated circuit substrate 526, IC pads 528 and seal ring 530. A movable actuator 522 is created by forming a plurality of trench patterns 520-1 and 520-2 on the device layer 504, for example, using a DRIE process. First permanent magnet 136 is located on the first actuator 522. Next, device pads 524, preferably made of germanium alloys are deposited and patterned on the device layer 504.

Integrated circuit substrate 526 includes one or more electronic circuits that communicate with various sensors formed on the device layer 504. IC pads 528, preferably made of aluminum alloys are deposited and patterned on the integrated circuit substrate 526. IC pads 528 are coupled to device pads 524 to provide a communication path to various sensors formed on the device layer 504. For example, device pads 524 may be eutectic bonded with IC pads 528.

Standoff 514-1 surrounds various devices formed on the device layer 504. A seal ring 530 is formed on the standoff 514-1 to bond the device layer 504 with integrated circuit substrate 526, for example, to hermitically seal various devices formed on the device layer 504. Height of the standoff 514-1, along with seal ring 530 define height of the lower cavity 532.

FIG. 5C shows a cross-section of the substrate 500 shown in FIG. 5, along an axis y-y', with the second permanent magnet 138, according to one aspect of the present disclosure. In one example, axis y-y' is substantially orthogonal to axis x-x'. FIG. 5C may be substantially similar to the FIG. 5B, except that FIG. 5C shows alternating layers of FM and AFM layers deposited and patterned on the lower side 515 of the device layer 504, to form second magnetic strip 540. FM layers and AFM layers may be FM2 layer and AFM2 layer, as described with reference to FIG. 2B. Patterns of the deposited second magnetic strip 540 may be as described with reference to FIG. 4C and FIG. 4D. Note that when an external magnetic field in a second direction is applied to the second magnetic strip 540, at a temperature above the blocking temperature of the AFM2 material (but below the blocking temperature of the AFM1 material), the plurality of second magnetic strip 540 will be oriented in the second direction, to form second permanent magnet 138, as described with reference to FIG. 2B.

FIG. 5C further shows a movable second actuator 546 created by forming trench patterns 520-3 and 520-4 on the device layer 504, for example, using a DRIE process. The second permanent magnet 138 is located on the second actuator. As one skilled in the art appreciates, alternating layers of FM and AFM layers are deposited and patterned on the lower side 515 of the device layer 504, to form second magnetic strip 540, before forming any trench patterns on the device layer 504.

In some embodiments, a second protective layer 548 is deposited over the second permanent magnet 138, to prevent oxidization of the second permanent magnet 138. For example, protective layer 548 may be an oxide layer deposited using a low temperature plasma-enhanced chemical vapor deposition (PECVD) process. Protective layer 548 is preferably deposited immediately after forming the second magnetic strip 540 and prior to magnetic annealing process in order to minimize potential oxidization of second magnetic strip 540, for example, due to exposure to ambient environment.

As one skilled in the art appreciates, application of the external magnetic field in the second direction will not change the magnetic orientation of the first permanent magnet 136, as the blocking temperature of the AFM1 layer is higher than the blocking temperature of the AFM2 layer. For example, first permanent magnet 136 and second permanent magnet 138 may each be oriented in a different direction sequentially, by applying external magnetic field in the desired direction at different temperatures, as previously discussed with reference to FIG. 2A and FIG. 2B.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A device, comprising:
a magnetic sensor including a plurality of sensing elements, a first permanent magnet and a second permanent magnet, wherein,
the first permanent magnet is deposited on a movable actuator and the second permanent magnet is deposited on another movable actuator,
the first permanent magnet deposited with at least one alternating ferromagnetic (FM) layer and antiferromagnetic (AFM) layer and the second permanent magnet deposited with at least one alternating FM layer and AFM layer; and
the first permanent magnet is magnetized in a first direction and the second permanent magnet is magnetized in a second direction which is substantially orthogonal to the first direction, wherein the blocking temperature of the AFM layer of the first permanent magnet is higher than the blocking temperature of the AFM layer of the second permanent magnet; and wherein,
a subset of the plurality of sensing elements including at least one electrode configured to move relative to the subset of the plurality of sensing elements, based upon a movement of the first permanent magnet deposited on the movable actuator; and
another subset of the plurality of sensing elements including at least another one electrode configured to move relative to the another subset of the plurality of sensing elements, based upon a movement of the second permanent magnet deposited on the another movable actuator.

2. The device of claim 1, wherein the first permanent magnet is magnetized in the first direction by applying an external magnetic field in the first direction, at a temperature greater than the blocking temperature of the AFM layer of the first permanent magnet.

3. The device of claim 2, wherein the second permanent magnet is magnetized in the second direction by applying another external magnetic field in the second direction, at a temperature greater than the blocking temperature of the AFM layer of the second permanent magnet, but less than the blocking temperature of the AFM layer of the first permanent magnet.

4. The device of claim 3, wherein the first permanent magnet deposited on the movable actuator is deposited in a stripe pattern with a long side and a short side, a ratio of a width to a length of the stripe pattern define an aspect ratio, where the aspect ratio is in the range of 1:1 to 1:1.5 and the second permanent magnet deposited on the another movable actuator is deposited in a stripe pattern with a long side and a short side, a ratio of a width to a length of the stripe pattern define an aspect ratio, wherein the aspect ratio is in the range of 1:1 to 1:5.

5. The device of claim 4, wherein the short side is shaped such that the longest distance along the long side is substantially along the center of the stripe pattern.

6. The device of claim 5, wherein the short side has a shape of a symmetric convex parabola.

7. The device of claim 5, wherein the short side has a shape of an isosceles triangle.

8. The device of claim 3, further including a plurality of second permanent magnets deposited on the another movable actuator, wherein a subset of the plurality of second permanent magnets form a third magnet bank and another subset of the plurality of second permanent magnets form a fourth magnet bank.

9. The device of claim 1, wherein each of the first permanent magnet and the second permanent magnet deposited with a plurality of alternating layers of FM layer and AFM layer, wherein each of the FM layer and the AFM layer has a thickness between about 10 angstroms and about 1000 angstroms.

10. The device of claim 9, wherein total thickness of the alternating layers of FM layer and AFM layer is between about 0.1 micrometer and about 1.5 micrometer.

11. The device of claim 1, wherein the AFM layer of the first permanent magnet is substantially made of an alloy of nickel manganese.

12. The device of claim 1, wherein the AFM layer of the second permanent magnet is substantially made of an alloy of ferromanganese.

13. The device of claim 1, wherein the first permanent magnet is magnetized at a temperature at least 100 degrees greater than the temperature at which the second permanent magnet is magnetized.

14. The device of claim 1, further including:
a substrate, the substrate including a handle layer and a device layer, wherein the first permanent magnet and the second permanent magnet are deposited on the device layer, a protective oxide coating disposed on the first permanent magnet and the second permanent magnet .

15. The device of claim 14, further including:
an integrated circuit substrate with a plurality of IC pads;
a first sensor formed on the device layer, with the first permanent magnet;
a second sensor formed on the device layer, with the second permanent magnet;
a plurality of device pads coupled to the first sensor and the second sensor;
wherein the plurality of device pads are selectively coupled to the plurality of IC pads so as to process signals generated by the first sensor and the second sensor.

16. The device of claim 15, wherein the device layer is coupled to the integrated circuit substrate with a eutectic metal seal so as to form a device cavity.

17. The device of claim 15, wherein each of the first sensor and second sensor are configured to measure in-plane or out-of plane movements.

18. The device of claim 1, further including a substrate, the substrate including a device layer, wherein the movable actuator is formed on the device layer.

19. The device of claim 1, further including a plurality of first permanent magnets deposited on the movable actuator, wherein a subset of the plurality of first permanent magnets form a first magnet bank and another subset of the plurality of first permanent magnets form a second magnet bank.

20. The device of claim 1, wherein the at least one electrode of the subset of the plurality of sensing elements moves relative to an another electrode of the subset of the plurality of sensing elements, to change a gap between the at least one electrode and the another electrode, based upon the movement of the first permanent magnet deposited on the movable actuator; and wherein the at least another one electrode of the another subset of the plurality of sensing elements moves relative to an another electrode of the another subset of the plurality of sensing elements, to change a gap between the at least another one electrode and the another electrode, based upon the movement of the second permanent magnet deposited on the another movable actuator.

21. A method for providing a device, comprising:
providing a magnetic sensor including a plurality of sensing elements, a first permanent magnet and a second permanent magnet, wherein, the first permanent magnet is formed on a movable actuator and the second permanent magnet is formed on another movable actuator,
each of the first permanent magnet and the second permanent magnet formed with at least one alternating ferromagnetic(FM) layer and antiferromagnetic (AFM) layer; and
magnetizing the first permanent magnet in a first direction and magnetizing the second permanent magnet in a second direction which is substantially orthogonal to the first direction, wherein the blocking temperature of the AFM layer of the first permanent magnet is higher than the blocking temperature of the AFM layer of the second permanent magnet; and wherein,
a subset of the plurality of sensing elements including at least one electrode configured to move relative to the subset of the plurality of sensing elements, based upon a movement of the first permanent magnet deposited on the movable actuator; and
another subset of the plurality of sensing elements including at least another one electrode configured to move relative to the another subset of the plurality of sensing elements, based upon a movement of the second permanent magnet deposited on the another movable actuator.

22. The method of claim 21, wherein the first permanent magnet is magnetized in the first direction by applying an external magnetic field in the first direction, at a temperature greater than the blocking temperature of the first permanent magnet.

23. The method of claim 22, wherein the second permanent magnet is magnetized in the second direction by applying another external magnetic field in the second direction, at a temperature greater than the blocking temperature of the second permanent magnet, but less than the blocking temperature of the first permanent magnet.

24. The method of claim 23, further including, depositing a plurality of second permanent magnets on the movable actuator, wherein a subset of the plurality of second permanent magnets form a third magnet bank and another subset of the plurality of second permanent magnets form a fourth magnet bank.

25. The method of claim 21, wherein the first permanent magnet deposited on the movable actuator is formed in a stripe pattern with a long side and a short side, a ratio of a width to a length of the stripe pattern define an aspect ratio, where the aspect ratio is in the range of 1:1 to 1:1.5 and the second permanent magnet deposited on the another movable actuator is formed in a stripe pattern, with a long side and a short side, a ratio of a width of the stripe pattern to the length of the stripe pattern define an aspect ratio, wherein the aspect ratio is between the range of about 1:1 and about 1:5.

26. The method of 25, wherein the short side is shaped such that the longest distance along the long side is substantially along the center of the stripe pattern.

27. The method of claim 26, wherein the short side has a shape of a symmetric convex parabola.

28. The method of claim 26, wherein the short side has a shape of an isosceles triangle.

29. The method of claim 21, wherein each of the first permanent magnet and the second permanent magnet deposited with a plurality of alternating layers of FM layer and AFM layer, wherein each of the FM layer and the AFM layer has a thickness between 10 angstroms and about 1000 angstroms.

30. The method of claim 29, wherein total thickness of the alternating layers of FM layer and AFM layer is between about 0.1 micrometer and about 1.5 micrometer.

31. The method of claim 21, wherein the AFM layer of the first permanent magnet is substantially made of an alloy of nickel manganese.

32. The method of claim 21, wherein the AFM layer of the second permanent magnet is substantially made of an alloy of ferromanganese.

33. The method of claim 21, wherein the first permanent magnet is magnetized at a temperature at least 100 degrees greater than the temperature at which the second permanent magnet is magnetized.

34. The method of claim 21, further including:
a substrate, the substrate including a handle layer and a device layer, wherein the first permanent magnet and the second permanent magnet are formed on the device layer, a protective coating disposed on the first permanent magnet and the second permanent magnet.

35. The method of claim 34, further including:
disposing an integrated circuit layer with a plurality of IC pads;
forming a first sensor on the device layer, with the first permanent magnet;
forming a second sensor on the device layer, with the second permanent magnet;
coupling a plurality of device pads to the first sensor and the second sensor, wherein the plurality of device pads are selectively coupled to the plurality of IC pads so as to process signals generated by the first sensor and the second sensor.

36. The method of claim 35, wherein the device layer is coupled to the integrated circuit layer with a eutectic metal seal so as to form a device cavity.

37. The method of claim 35, wherein each of the first sensor and the second sensor are configured to measure in-plane or out-of-plane movements.

38. The method of claim 21, further including a substrate, the substrate including a device layer, wherein the movable actuator is formed on the device layer.

39. The method of claim 21, further including, depositing a plurality of first permanent magnets on the movable actuator, wherein a subset of the plurality of first permanent magnets form a first magnet bank and another subset of the plurality of first permanent magnets form a second magnet bank.

40. The method of claim 21, wherein the at least one electrode of the subset of the plurality of sensing elements moves relative to an another electrode of the subset of the plurality of sensing elements, to change a gap between the at least one electrode and the another electrode, based upon the movement of the first permanent magnet deposited on the movable actuator; and wherein the at least another one electrode of the another subset of the plurality of sensing elements moves relative to an another electrode of the another subset of the plurality of sensing elements, to change a gap between the at least another one electrode and the another electrode, based upon the movement of the second permanent magnet deposited on the another movable actuator.

\* \* \* \* \*